United States Patent
Barr et al.

(10) Patent No.: US 6,948,043 B2
(45) Date of Patent: Sep. 20, 2005

(54) MANAGEMENT OF A MEMORY SUBSYSTEM

(75) Inventors: Andrew H. Barr, Roseville, CA (US); Ricardo Espinoza-Ibarra, Carmichael, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 439 days.

(21) Appl. No.: 10/216,435

(22) Filed: Aug. 12, 2002

(65) Prior Publication Data

US 2004/0027867 A1 Feb. 12, 2004

(51) Int. Cl.⁷ .............................................. G06F 12/00
(52) U.S. Cl. ...................... 711/170; 711/172; 708/309; 708/311
(58) Field of Search ...................... 711/170–4; 708/309, 708/311

(56) References Cited

U.S. PATENT DOCUMENTS

2001/0003198 A1 * 6/2001 Wu ............................ 711/104
2001/0014049 A1   8/2001 Woo et al.

OTHER PUBLICATIONS

Search Report issued on Dec. 18, 2003 in counterpart foreign application in GB under application No. 315099.2.

* cited by examiner

*Primary Examiner*—Nasser Moazzami
*Assistant Examiner*—Ngoc Dinh

(57) ABSTRACT

A method of optimizing performance of a memory subsystem in a computer system. This method including the step of informing the computer system of what type of memory module loading is present in the memory subsystem. The method also includes operating the memory subsystem at a first frequency that is at a chosen ratio to a second frequency at which a frontside bus (FSB) operates. Further, the method includes optimizing the performance of the memory subsystem by changing the ratio.

21 Claims, 4 Drawing Sheets

Operation Frequency = $f_1$

Operation Frequency = $f_2 > f_1$

MANAGEMENT OF A MEMORY SUBSYSTEM

CROSS-REFERENCE TO RELATED APPLICATIONS

This application is related to U.S. patent application Ser. No. 10/216,437, entitled "SYSTEM, METHOD AND APPARATUS FOR THE FREQUENCY MANAGEMENT OF BLADES IN A BLADED ARCHITECTURE BASED ON PERFORMANCE REQUIREMENTS" to Andrew H. BARR, et al.; U.S. patent application Ser. No. 10/216,438, entitled "SYSTEM AND METHOD FOR THE FREQUENCY MANAGEMENT OF COMPUTER SYSTEMS TO ALLOW CAPACITY ON DEMAND" to Andrew H. BARR, et al.; U.S. patent application Ser. No. 10/216,283, entitled "SYSTEM, METHOD AND APPARATUS FOR PERFORMANCE OPTIMIZATION AT THE PROCESSOR LEVEL" to Ricardo ESPINOZA-IBARRA, et al.; U.S. patent application Ser. No. 10/216,234, entitled "SYSTEM AND METHOD FOR LOAD DEPENDENT FREQUENCY AND PERFORMANCE MODULATION IN BLADED SYSTEMS" to Ricardo ESPINOZA-IBARRA, et al.; U.S. patent application Ser. No. 10/216,284, entitled "VOLTAGE MANAGEMENT OF BLADES IN A BLADED ARCHITECTURE BASED ON PERFORMANCE REQUIREMENTS" to Andrew H. BARR, et al.; U.S. patent application Ser. No. 10/216,286, entitled "VOLTAGE MODULATION IN CONJUNCTION WITH PERFORMANCE OPTIMIZATION AT PROCESSOR LEVEL" to Andrew H. BARR, et al.; U.S. patent application Ser. No. 10/216,235, entitled "SYSTEM AND METHOD FOR MANAGING THE OPERATING FREQUENCY OF PROCESSORS OR BLADES" to Ricardo ESPINOZA-IBARRA, et al.; U.S. patent application Ser. No. 10/216,229, entitled "SYSTEM AND METHOD FOR MANAGING THE OPERATING FREQUENCY OF BLADES IN A BLADED-SYSTEM" to Ricardo ESPINOZA-IBARRA, et al.; U.S. patent application Ser. No. 10/216,233, entitled "VOLTAGE MANAGEMENT OF PROCESSORS IN A BLADED SYSTEM BASED ON LOADING" to Andrew H. BARR, et al., and U.S. patent application Ser. No. 10/216,232, entitled "SYSTEM AND METHOD FOR VOLTAGE MANAGEMENT OF A PROCESSOR TO OPTIMIZE PERFORMANCE AND POWER DISSIPATION" to Andrew H. BARR, et al., all of which are concurrently herewith being filed under separate covers, the subject matters of which are herein incorporated by reference.

BACKGROUND

Computers typically include memory subsystems that allow for data storage and retrieval. The memory subsystems often include at least one memory board and a set of memory modules, such as Dual In-Line Memory Modules (DIMMs), which may be loaded into slots that are present on the memory board. The spacing of these memory modules is constrained by mechanical board space requirements and the ability to cool the memory modules.

When the memory modules are loaded into the slots such that the modules are spaced closely together, the amount of data that may be stored on the memory board is maximized. However, these memory modules have less available air flow between them and are more difficult to cool. Thus, memory modules that are spaced closer together must be run at a lower power (i.e., at a lower frequency).

When the memory modules are loaded into the slots such that the modules are spaced further apart from each other, the memory access time may be minimized since the ability to cool the modules is increased and the modules to be run at higher frequencies. However, the increased spacing between the modules lowers the amount of data that may be stored on the memory board.

The memory subsystems of currently available computer systems require that a sacrifice be made of either memory size, memory performance (i.e., access time), or both. No one piece of hardware is capable of optimizing a memory subsystem for performance and memory size, depending on the need of the computer system.

SUMMARY

A method of optimizing performance of a memory subsystem in a computer system, the method including the steps of informing the computer system of what type of memory module loading is present in the memory subsystem, operating the memory subsystem at a first frequency that is at a chosen ratio to a second frequency at which a frontside bus (FSB) operates, and optimizing performance of the memory subsystem by changing the ratio.

A method of optimizing performance of a memory subsystem in a computer system, the method including the steps of operating the memory subsystem at a first frequency that is asynchronous to a second frequency at which a Frontside Bus (FSB) is operating, controlling the first frequency via a separate frequency generator, and inputting a signal into the frequency generator.

DESCRIPTION OF THE DRAWINGS

The detailed description will refer to the following drawings, wherein like numerals refer to like elements, and wherein.

DETAILED DESCRIPTION

Some preferred embodiments of devices and methods of optimizing performance of one or more memory subsystems will now be described in detail with reference to the following figures, in which like numerals refer to like elements.

Figure 1A:
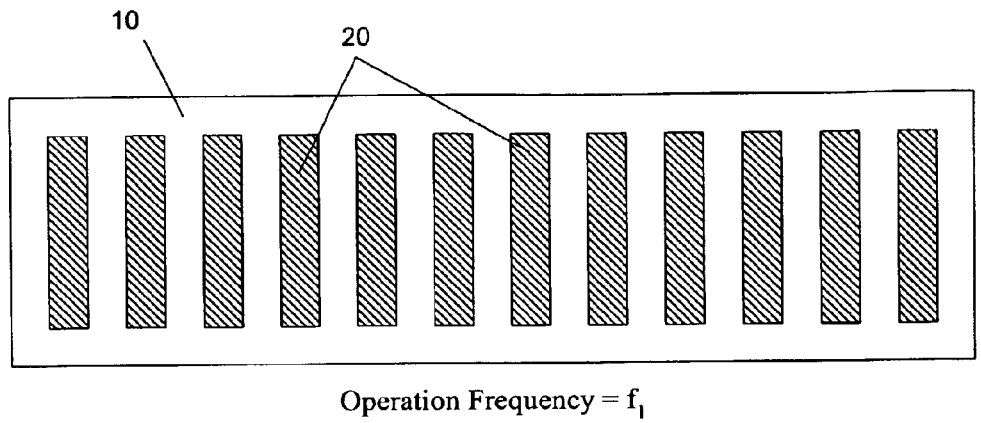
FIG. 1A illustrates a plan view of a memory board wherein all of the slots of the memory board are loaded with memory modules that are operating at frequency $f_1$.

With reference to FIG. 1A of the Drawings, there is illustrated therein a plan view of a memory board 10 wherein all of the slots of the memory board 10 are loaded with memory modules 20. The memory modules 20 may include, but are not limited to, Dual In line Memory Modules (DIMMs). The memory modules 20 shown in FIG. 1A may be operated at a first frequency $f_1$.

Figure 1B:
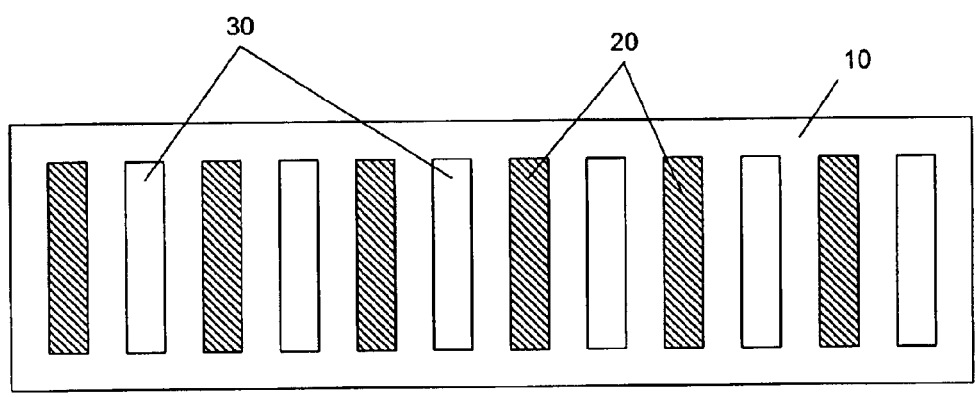
FIG. 1B illustrates a plan view of a memory board where every other slot of the memory board is loaded with a memory module that is operating at frequency $f_2$, where frequency $f_2$ is higher than frequency $f_1$.

With reference to FIG. 1B of the Drawings, there is illustrated therein a plan view of a memory board 10 where every other slot of the memory board 10 is an empty or unloaded slot 30 and wherein the remaining slots are loaded with memory modules 20 (e.g., DIMMs) that may be operated at a second frequency $f_2$. Because there is more spacing between the memory modules 20 illustrated in FIG. 1B, cooling may be performed more efficiently and the second frequency $f_2$ may be higher than the first frequency $f_1$.

FIGS. 1A and 1B illustrate the trade-off that can be made between dense memory module 20 spacing (illustrated in FIG. 1A) and memory performance (illustrated in FIG. 1B). The memory board 10 in FIG. 1A has a dense loading of memory modules 20 and the loaded slots in the memory board 10 are very close together. For system applications where memory size is the most important parameter and where access time performance is of lesser importance, a memory board 10 loaded as shown in FIG. 1A may be preferable. In order to meet the cooling constraints discussed above, a memory subsystem that includes a memory board 10 such as the one shown in FIG. 1A could be run at first frequency $f_1$ that is lower than the maximum possible frequency at which the memory subsystem could be run under alternate cooling conditions.

The memory board 10 in FIG. 1B may preferably be used in system applications that require the best access time performance available from the memory modules 20 and wherein memory size is of lesser importance. As shown in FIG. 1B, every other slot in the memory board 10 has a memory module 20 (e.g., a DIMM) loaded into the slot. This type of configuration allows for increased airflow around the memory modules 20 and facilitates cooling. Hence, the configuration illustrated in FIG. 1B allows the memory modules 20 to be run or operated at a higher, second frequency $f_2$, thereby providing greater performance of the memory subsystem.

Now that fully loaded and an alternatingly loaded memory boards 10 have been discussed, two exemplary methods for informing a computer system of the type of memory module loading that is present will be discussed. Two exemplary methods for implementing frequency changes, thereby optimizing the performance of the memory subsystem, will also be discussed. It will become apparent that the exemplary methods for implementing frequency changes are often dependent upon the memory subsystem architecture available. However, it should be noted that frequency modulation may be performed with identical hardware and software. In other words, a user does not need to buy a different memory board to switch between frequencies.

The first exemplary method for informing the computer system of the type of memory module loading that is present makes use of the serial presence detect (SPD) mechanism. Various versions of SPD mechanisms are generally known in the art and any SPD mechanism available may be chosen. According to a general SPD mechanism, when a computer system is booted, the memory modules within the computer system may be properly configured for maximum reliability and performance, using information about that modules' size, data width, speed, and voltage. This information may be stored in an electrically erasable programmable read-only memory (EEPROM).

Implementation of an SPD mechanism may be through an I²C-based Intelligent Platform Management Bus (IPBM) interface. Such an interface generally provides a bi-directional communication link and a way to communicate with "intelligent" hardware that can monitor and control system health and performance. However, other ways of implementing the SPD mechanism will be apparent to one skilled in the art.

The second exemplary method for informing the computer system of the type of memory module loading that is present makes use of a user interface. Using the interface, the user may specifically inform the system to operate the memory at a higher or lower frequency (e.g., at first frequency $f_1$ or at second frequency $f_2$). According to this method, the user may also load the memory modules (e.g., DIMMs) appropriately into the slots of the memory board and an SPD may be used to enforce the proper loading of memory modules (i.e., the SPD may prevent the computer system from operating if the frequency is improper for the memory module loading).

The first exemplary method for implementing frequency changes, thereby optimizing the performance of the memory subsystem, will be discussed with reference to a Pluto-based computer system (e.g., Everest). Generally, Pluto is the Central Electronic Complex (CEC) device that controls memory, front side bus (FSB), and Input/Output (I/O) in a computer system. According to a Pluto-based computer system, the memory subsystem contained therein may be operated at a frequency that is at a chosen ratio to the frequency of the frontside bus (FSB). This ratio can be programmed and/or changed. If the ratio is changed, the frequency at which the memory subsystem operates is generally changed as well.

The ratio may be changed by a user who can access registers that control the ratio via, for example, a Guardian Service Processor (GSP) console. Alternately, the SPD may detect how the memory is loaded and then automatically configure the frequency ratio accordingly. Each of these options are discussed below.

When a user accesses one or more registers that control the frequency ratio, this accessing step may be performed either before powering up the memory subsystem or at any other convenient time. Once one or more registers have been accessed, the accessed registers may be set.

According to certain methods for optimizing the performance of a memory subsystem, the registers may be set to allow the memory subsystem to run at full speed in a substantially 1:1 ratio to the FSB frequency. According to other methods, the registers may be set to allow the memory subsystem to run at full speed in a ratio greater than 1:1 to the FSB frequency. According to yet other methods, the registers may be set to allow the memory subsystem to run at less than full speed. Which type of setting the user chooses depends upon the specific requirements of that user.

When the SPD is used to detect how the memory is loaded, the memory subsystem could be configured to run at full speed and full power when the SPD detects that every other slot of the memory board is loaded with a memory storage module (e.g., DIMM). More generally, a full speed and full power type of configuration could be used whenever enough airflow is available to cool the memory storage modules. For example, when 75%, 80%, 85%, or 90% of the slots are loaded with memory storage modules in an alternating manner, the full speed and full power configuration could be adopted.

Alternately, when the SPD detects that all or substantially all (e.g., 75%, 80%, 85%, or 90%) of the slots of the memory board are loaded with memory storage modules, the memory subsystem could be configured to run at a power level and frequency that would allow the memory subsystem to be appropriately cooled. In other words, when the SPD detects that all slots are loaded, the memory subsystem could be run at frequency $f_1$ and, when the SPD detects that every other slot is loaded, the memory subsystem could be operated at frequency $f_2$, which is higher than frequency $f_1$.

Once all of the individual modules have been properly configured, either by the user or via the SPD, in a Pluto-based system, further optimization of the performance of the memory subsystem may be performed by modulating the voltage applied to the memory subsystem. How to modulate the voltage to optimize performance will become obvious to those skilled in the art when operating a computer system such as the ones discussed above The second exemplary method for implementing frequency changes, thereby optimizing the performance of the memory subsystem, relates to computer systems and architectures where the memory subsystem runs asynchronously to the FSB (or any other processor bus). In such systems, the memory subsystem may have its own frequency, which may be independent of other frequencies in the system, or may be run at a ratio.

Figure 2:
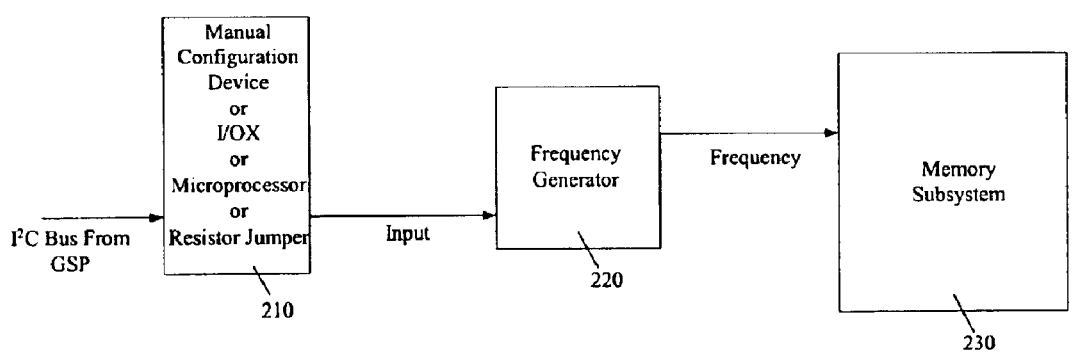
FIG. 2 illustrates a block diagram depicting one methodology of managing the operating frequency of individual memory storage modules by use of either a manual configuration device (e.g., a dip switch), Input/Output Expander (I/OX) chip, microprocessor/microcontroller, or resistor jumper.

With reference to FIG. 2, which illustrates a block diagram 200 depicting one methodology of managing the operating frequency of a memory subsystem 230, the frequency of the memory subsystem 230 may be controlled by a separate frequency generator 220. An input signal into the frequency generator 220 may be controlled by controlling a manual configuration device (e.g., a dip switch), an Input/Output Expander (I/OX) chip, a microprocessor/microcontroller, and/or a resistor jumper, generally designated by the reference numeral 210. One of ordinary skill in the art would recognize that there are many common manual configuration devices that are capable of performing the desired function. For example, dip switches, jumpers installed over pin heads, rotational configuration switches, and/or solder bridges may be used. The frequency generator 220 may also be controlled by a programmable gate array (FPGA), or a programmable logic device (PLD) (not illustrated). The frequency generator 220 may include a serial configuration input that controls the frequency output to the memory subsystem or may, instead, use a parallel configuration input to control the frequency output.

Once all of the necessary components described above have been provided, the performance of the memory subsystem 230 may be optimized by controlling the frequency configuration bits for the memory storage modules (e.g., DIMMs) in the memory subsystem 230 with the separate frequency generator 220. This controlling step may make use of an $I^2C$-based I/OX. When an I/OX is used, a GSP may be used to access the I/OX.

As alternatives to using an I/OX, one or more manual configuration devices (e.g., dip switches) may be used to control the frequency configuration bits. Likewise, one or more microprocessors and/or resistor jumpers may be used. Also, to further optimize the performance of a memory subsystem, the voltage of the memory storage modules may be modulated.

When using a manual configuration device and/or resistor jumper 210, the manual configuration device and/or resistor jumper 210 may be added to a readily-accessible part of the computer system and may be manually manipulated. However, any of the I/OX, microprocessor/microcontroller, FPGA, or PLD 210 may also be accessible via an $I^1C$ bus from the GSP.

Thus, the GSP may be used to indirectly set the frequency of the memory storage modules (e.g., DIMMs) by controlling any I/OXs, microprocessors/microcontrollers, FPGA and/or PLD 210 that are being used. This controls an input signal into the independent frequency generator 220 and modifies the frequency of the memory storage module.

Figure 3:
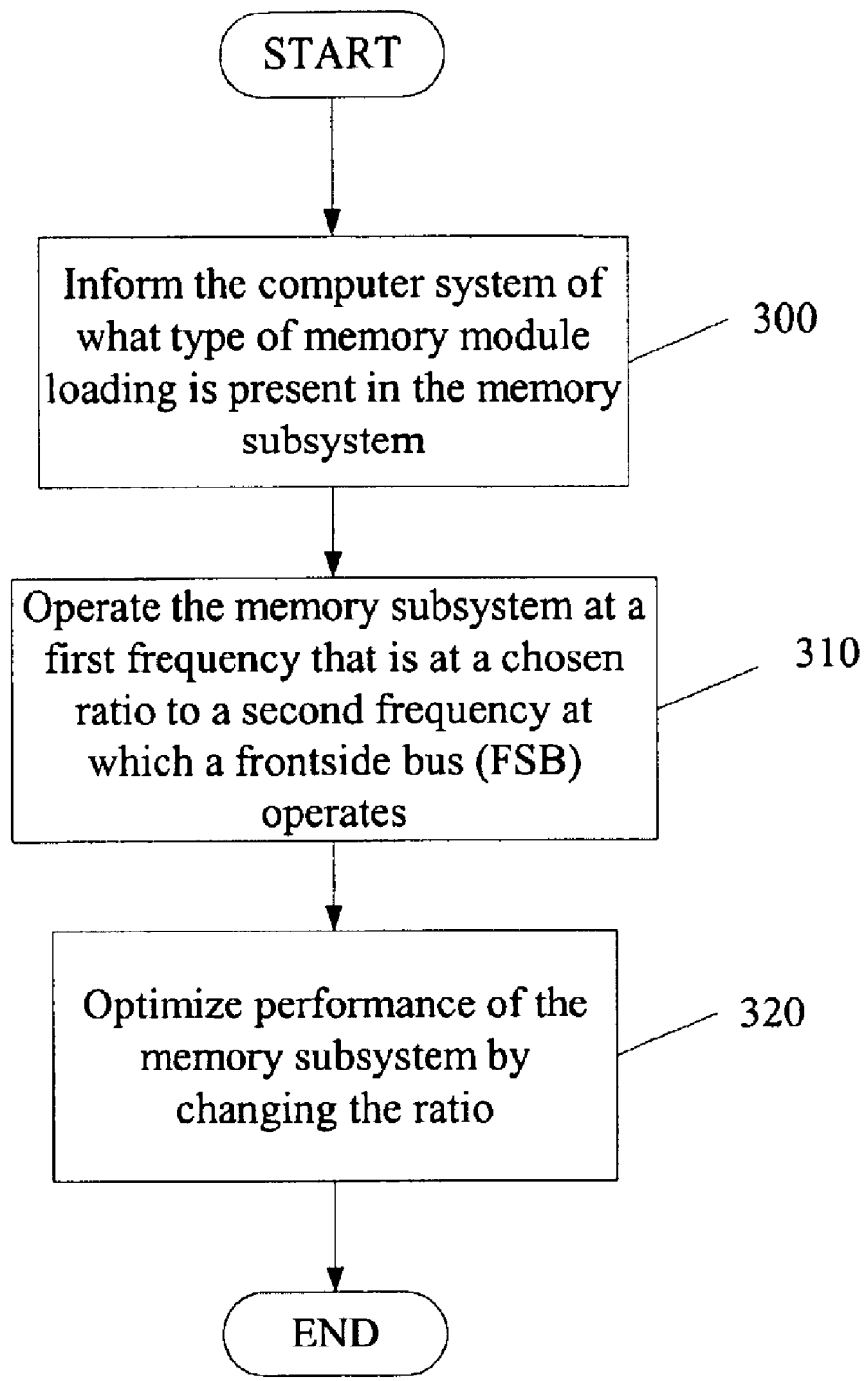
FIG. 3 illustrates a flowchart that includes the steps of a first exemplary method for optimizing the performance of a memory subsystem in a computer system.

FIG. 3 illustrates a flowchart that includes the steps of a first exemplary method for optimizing the performance of a memory subsystem in a computer system. Step 300 of the method specifies informing the computer system of what type of memory module loading is present in the memory subsystem. In other words, the computer system, during this step, is informed of whether all of the slots in the memory board are loaded, or substantially loaded, with memory modules (e.g., DIMMS). Step 310 of the method specifies operating the memory subsystem at a first frequency that is at a chosen ratio to a second frequency at which a frontside bus (FSB) operates. For example, the frequency ratio may be 1:1 or greater than 1:1 when the memory subsystem is operating at full speed. Step 320 then specifies optimizing performance of the memory subsystem by changing the ratio. The chosen ratio generally depends upon the type of memory module loading detected in step 300.

Figure 4:
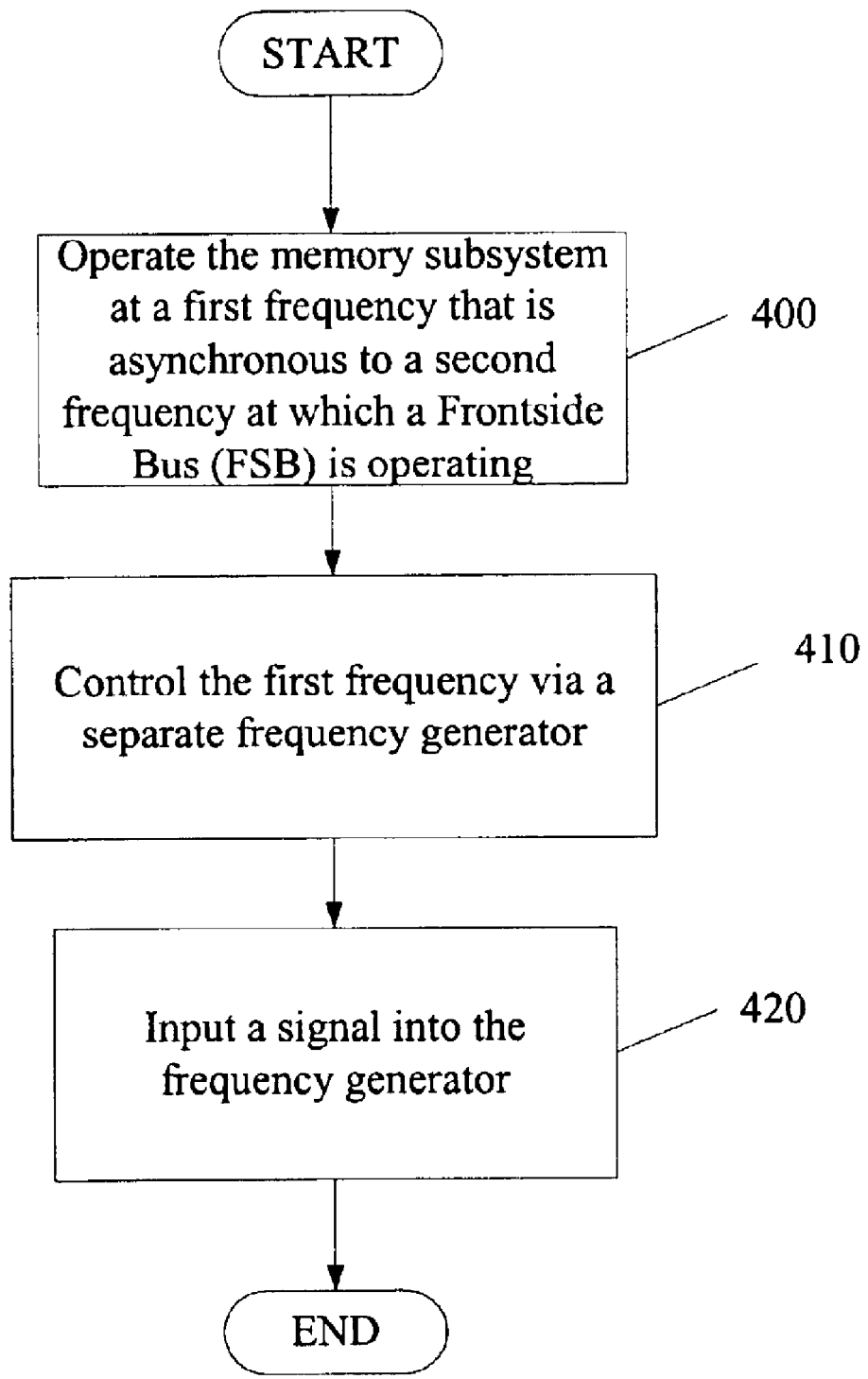
FIG. 4 illustrates a flowchart that includes the steps of a second exemplary method for optimizing the performance of a memory subsystem in a computer system.

FIG. 4 illustrates a flowchart that includes the steps of a second exemplary method for optimizing the performance of a memory subsystem in a computer system. Step 400 of the method specifies operating the memory subsystem at a first frequency that is asynchronous to a second frequency at which a Frontside Bus (FSB) is operating. Step 410 then specifies controlling the first frequency via a separate frequency generator. Finally, step 420 specifies inputting a signal into the frequency generator. The signal inputted during step 420 may have an effect on the frequency generator that alters the manner in which the frequency generator controls the first frequency. Typically, the inputted signal may be controlled by at least one of a manual configuration device (e.g., a dip switch), an Input/Output Expander (IOX) chip, a microprocessor/microcontroller, a resistor jumper, a FPGA, and a programmable logic device (PLD)

While devices and methods for optimizing the performance of a memory subsystem have been described in connection with exemplary embodiments, those skilled in the art will understand that many modifications in light of these teaching are possible, and this application is intended to cover any variation thereof.

For example, the devices and methods disclosed make use of DIMMs to store data. However, other types of memory storage modules could likewise be used. Thus, DIMMs are shown and referenced generally throughout this disclosure, and, unless specifically noted, are intended to represent any and all devices/technologies appropriate to perform the desired function. Likewise, there are disclosed several processors that perform various operations. The specific processor is not important to the methods and/or devices described herein. Thus, it is not applicants' intention to limit the methods and/or devices described herein to any particular form of processor.

Further examples exist throughout the disclosure, and it is not applicants' intention to exclude from the scope of the methods and/or devices described herein the use of structures, materials, or acts that are not expressly identified in the specification, but nonetheless are capable of performing a claimed function.

What is claimed is:

1. A method of optimizing performance of a memory subsystem in a computer system, the method comprising the steps of:
   informing the computer system of what type of memory module loading is present in the memory subsystem, wherein a particular type of memory module loading has a spacing between memory modules different from other types of memory module loading;
   operating the memory subsystem at a first frequency that is at a chosen ratio to a second frequency at which a frontside bus (FSB) operates; and
   optimizing performance of the memory subsystem by changing the ratio based on the spacing between the memory modules.

2. The method of claim 1, wherein the informing step comprises using a serial presence detect (SPD) mechanism.

3. The method of claim 2, wherein the informing step comprises using the SPD to configure memory modules included in the memory subsystem.

4. The method of claim 2, wherein the informing step comprises using an $I^2C$-based Intelligent Platform Bus (IPBM) interface.

5. The method of claim 1, wherein the informing step comprises making use of a user interface to change the first frequency.

6. The method of claim 5, wherein the informing step comprises using an SPD to enforce proper loading of memory modules in the memory subsystem.

7. The method of claim 1, wherein the optimizing step comprises setting the ratio via a Guardian Service Processor (GSP) console.

8. The method of claim 1, wherein the optimizing step comprises automatically configuring the ratio based on results of SPD detection of the memory module loading.

9. The method of claim 1, wherein the optimizing step comprises setting the memory subsystem to run at full speed with the first frequency in a substantially 1:1 ratio to the second frequency.

10. The method of claim 1, wherein the optimizing step comprises setting the memory subsystem to run at full speed with the first frequency in a greater than 1:1 ratio to the second frequency.

11. The method of claim 1, wherein the optimizing step comprises setting the memory subsystem to run at less than full speed.

12. The method of claim 1, further comprising the step of:
   modulating a voltage of the memory subsystem.

13. A method of optimizing performance of a memory subsystem in a computer system, the method comprising the steps of:
   informing the computer system of what type of memory module loading is present in the memory subsystem, wherein a particular type of memory module loading has a spacing between memory modules different from other types of memory module loading;
   operating the memory subsystem at a first frequency that is asynchronous to a second frequency at which a Frontside Bus (FSB) is operating;
   controlling the first frequency via a separate frequency generator based on the spacing between the memory modules; and
   inputting a signal into the frequency generator.

14. The method of claim 13, wherein the operating step comprises operating the memory subsystem at the first frequency which is independent of other frequencies in the computer system.

15. The method of claim 13, wherein the operating step comprises operating the memory subsystem at the first frequency which is at a ratio to another frequency in the computer system.

16. The method of claim 13, wherein the controlling step comprises using an $I^2C$-based I/OX.

17. The method of claim 13, wherein the inputting step comprises controlling the signal with a manual configuration device.

18. The method of claim 13, wherein the inputting step comprises controlling the signal with an Input/Output Expander (I/OX) chip.

19. The method of claim 13, wherein the inputting step comprises controlling the signal with at least one of a microprocessor and a microcontroller.

20. The method of claim 13, wherein the inputting step comprises controlling the signal with a resistor jumper.

21. The method of claim 13, further comprising the step of:
   modulating a voltage of the memory subsystem.

* * * * *